(12) United States Patent
Liu

(10) Patent No.: US 9,966,559 B2
(45) Date of Patent: May 8, 2018

(54) GLASS PACKAGING STRUCTURE AND GLASS PACKAGING METHOD OF UTILIZING THE SAME

(71) Applicant: SHENZHEN CHINA STAR OPTOELECTRONICS TECHNOLOGY CO., LTD., Shenzhen (CN)

(72) Inventor: Yawei Liu, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 674 days.

(21) Appl. No.: 14/234,395

(22) PCT Filed: Dec. 13, 2013

(86) PCT No.: PCT/CN2013/089378
§ 371 (c)(1),
(2) Date: Jan. 23, 2014

(87) PCT Pub. No.: WO2015/007050
PCT Pub. Date: Jan. 22, 2015

(65) Prior Publication Data
US 2015/0194627 A1    Jul. 9, 2015

(30) Foreign Application Priority Data
Jul. 17, 2013    (CN) .......................... 2013 1 0300272

(51) Int. Cl.
*H01L 51/56* (2006.01)
*H05B 33/10* (2006.01)
(Continued)

(52) U.S. Cl.
CPC ........ *H01L 51/5246* (2013.01); *C03B 23/245* (2013.01); *C03C 27/10* (2013.01);
(Continued)

(58) Field of Classification Search
CPC ... H01L 51/524–51/5246; H01L 51/56; H05B 33/04; H05B 33/10
See application file for complete search history.

(56) References Cited

U.S. PATENT DOCUMENTS 7,837,530 B2 *    11/2010    Park .................... H01L 51/5246
                                                           445/24
2002/0018911 A1 *    2/2002    Bernius ................ H01G 9/2077
                                                           428/690
(Continued)

FOREIGN PATENT DOCUMENTS

JP    2007194184 A    8/2007
JP    2010228998 A    10/2010
(Continued)

*Primary Examiner* — Mariceli Santiago
(74) *Attorney, Agent, or Firm* — Mark M. Friedman

(57) ABSTRACT

The present invention provides a glass packaging structure, comprising an active glass substrate and a packaging glass substrate. An active area is formed upon the active glass substrate. Glass packaging lines are formed on a surface of the packaging glass substrate and the glass packaging lines protruding from the packaging glass substrate. The packaging glass substrate entirely overlapping upon the active glass substrate and then the glass packaging lines are irradiated by a laser to couple the packaging glass substrate and the active glass substrate.

6 Claims, 4 Drawing Sheets

(51) Int. Cl.
*H01L 51/52* (2006.01)
*C03B 23/24* (2006.01)
*C03C 27/10* (2006.01)

(52) U.S. Cl.
CPC .............. *H05B 33/10* (2013.01); *Y02P 40/57* (2015.11); *Y10T 428/239* (2015.01)

(56) References Cited

U.S. PATENT DOCUMENTS

| | | | | |
|---|---|---|---|---|
| 2003/0066311 | A1* | 4/2003 | Li | C03C 27/06 65/43 |
| 2005/0140290 | A1* | 6/2005 | Park | H01L 27/3253 313/512 |
| 2007/0170839 | A1* | 7/2007 | Choi | C03C 8/24 313/500 |
| 2008/0138653 | A1* | 6/2008 | Lee | H01L 51/5246 428/690 |
| 2009/0142984 | A1* | 6/2009 | Logunov | H01L 51/5246 445/25 |
| 2011/0037383 | A1* | 2/2011 | Logunov | H01L 51/5246 313/512 |
| 2011/0209813 | A1 | 9/2011 | Shibuya et al. | |
| 2011/0265518 | A1* | 11/2011 | Matsumoto | H01J 9/261 65/43 |
| 2014/0217386 | A1* | 8/2014 | Hayashi | H01L 51/5203 257/40 |

FOREIGN PATENT DOCUMENTS

| | | |
|---|---|---|
| JP | 2011505667 A | 2/2011 |
| JP | 2012104397 A | 5/2012 |
| KR | 100649942 B1 * | 11/2006 |
| WO | 2010055888 A1 | 5/2010 |

* cited by examiner

GLASS PACKAGING STRUCTURE AND GLASS PACKAGING METHOD OF UTILIZING THE SAME

BACKGROUND OF THE INVENTION

1. Field of Invention

The present invention relates to a field of display technology, and more particularly, to a glass packaging structure and a glass packaging method of utilizing the same.

2. Description of Prior Art

In the field of display technology, liquid crystal displays/organic light emitting displays (LCD\OLED) have gradually replaced CRT displays. For the purpose of packaging the light source inside the glass substrate in an OLED, coupling two plain glass substrates is an essential technology which will direct affect the performance of the display.

The earliest packaging technology applying in an LCD\OLED is ultra violet (UV) solidification packaging technology. Because an LCD is less sensitive to moisture and oxygen, the UV solidification packaging technology became the most popular packaging technology in the field of LCD packaging. The UV solidification packaging technology is coating UV glue, which will solidify after the irradiation of UV light, between the two plain glass substrates. The reasons for the popularity of UV solidification packaging technology is as follows: using no solvent or less solvent reduces pollution of the environment, low power consumption means solidification at low temperatures which protects temperature-sensitive materials, high efficiency increases the speed of the production line, and little space is required for the equipment. However, the UV glue is an organic material, which means that the interval between molecules after solidification is large enough to let moisture and oxygen pass into the sealing area. Thus, UV solidification packaging technology is highly suitable of those fields which are less sensitive to moisture and oxygen, like LCD packaging.

With the progress of technology, "OLED", a more advanced display technology than "LCD", has shown up. However, an OLED is very sensitive to moisture and oxygen, and the lifespan of an OLED will be shortened by the penetration of moisture and oxygen if one applies UV solidification packaging technology.

A glass material (fit) packaging technology is a new type of plain glass packaging technology under development. This is done by making the glass powder into a solution with a certain viscosity, coating it on the packaging glass substrate, heating it to remove the solvent, aligning the packaging glass substrate and the other glass substrate, and melting the frit by laser and coupling the two glass substrates together. The frit packaging technology is much more suited to an OLED, which is sensitive to moisture and oxygen. However, the frit packaging technology also has the shortcoming that the height of the fit glue after solidification is very hard to control, owing to the baking technology and the coating technology.

BRIEF SUMMARY OF THE INVENTION

The purpose of the present invention is to provide a glass packaging structure and a glass packaging method utilizing the same. This can be achieved by forming glass packaging lines with a specific pattern upon a packaging glass substrate by a physical or chemical etching method, making the glass packaging lines have the same height, then irradiating the glass packaging lines by a laser to weld the two glass substrates together in order to avoid packaging failure caused by poor control of the height of the frit glue. Doing so will improve the defect-free rate and lower the cost of operation.

To achieve the above purpose, the present invention provides a glass packaging method comprising the following steps: providing an active glass substrate having an active area formed thereon; providing a packaging glass substrate forming glass packaging lines on a surface of the packaging glass substrate and the glass packaging lines protruding from the packaging glass substrate; making the surface of the packaging glass substrate with the glass packaging lines face to the active glass substrate; disposing the packaging glass substrate entirely overlapping upon the active glass substrate; irradiating the glass packaging lines by a laser to couple the packaging glass substrate and the active glass substrate.

In the embodiment of the present invention, the specific pattern of the glass packaging lines is formed on the packaging glass substrate by physical grinding, laser scanning or chemical etching. It is possible to ask the glass supplier to make the grinding equipment having the glass packaging lines at the same time as the glass substrate is formed. When the packaging glass substrate overlapping upon the active glass substrate, projected images of the glass packaging lines on a plane of the active glass substrate are out of the active area, and a distance from each packaging glass lines to any position of the active area is between 500-2500 μm. The frame of the display (dark area without LED) will be too wide if the distance between the packaging lines and the active area is too large. However, the active area and transistors will be damaged by the heat generated during welding if the distance between the packaging lines and the active area is too small.

The glass packaging lines has a height ranging between 1-1000 μm and a width ranging between 10-5000 μm.

The glass packaging lines formed upon the packaging glass substrate have the same height.

Projected images of the packaging lines on a plane of the active glass substrate are circular, rectangular, rectangular with radius, triangular, or irregular.

When disposing the packaging glass substrate entirely overlapping upon the active glass substrate, projected images of the glass packaging lines on a plane of the active glass substrate are out of the active area, and a distance from each packaging glass line to any portion of the active area to the packaging glass lines is between 500-2500 μm. The frame of the display (dark area without LED) will be too wide if the distance between the packaging lines and the active area is too large. However, the active area and transistors will be damaged by the heat generated during welding if the distance between the packaging lines and the active area is too small.

The packaging process of the packaging glass substrate and the active glass substrate is operated under the environment of Nitrogen ($N_2$), keeping the inside of the sealing at one atmosphere of pressure after combination.

The laser has a wavelength ranging between 800-1200 nanometers and a power ranging between 5-250 watts. The laser is controlled to move a focal spot thereof along the packaging glass lines to couple the packaging glass substrate and the active glass substrate.

The present invention provides a glass packaging structure comprising an active glass substrate having an active area formed thereon; a packaging glass substrate having glass packaging lines on a surface of the packaging glass substrate and the glass packaging lines protruding from the packaging glass substrate, and the surface of the packaging glass substrate with the glass packaging lines facing to the active glass substrate, the glass packaging lines coupling the packaging glass substrate and the active glass substrate.

The glass packaging lines formed upon the packaging glass substrate have the same height.

When disposing the packaging glass substrate entirely overlapping upon the active glass substrate, projected images of the glass packaging lines on a plane of the active glass substrate are out of the active area, and a distance from each packaging line to any position of the active area is between 500-2500 µm. The frame of the display (dark area without LED) will be too wide if the distance between the packaging lines and the active area is too large. However, the active area and transistors will be damaged by the heat generated during welding if the distance between the packaging lines and the active area is too small.

DETAILED DESCRIPTION OF THE PREFERRED EMBODIMENTS

Figure 1:
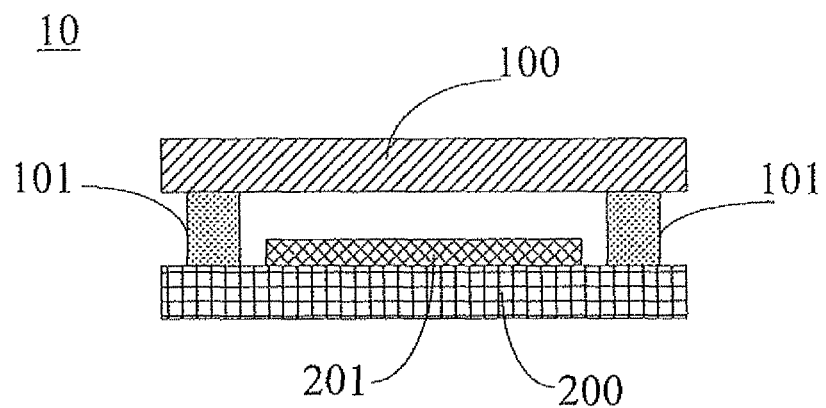
FIG. 1 is a side view drawing of a glass packaging structure of a first embodiment of the present invention.

The following description of every embodiment, with reference to the accompanying drawings, is used to exemplify a specific embodiment which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention. In the drawings, the components having similar structures are denoted by the same numerals.

FIG. 1 is a side view drawing of a glass packaging structure of a first embodiment of the present invention. The packaging structure comprises an active glass substrate 200 and a packaging glass substrate 100. Having an active area 201 upon the active glass substrate 200. Forming a glass packaging lines 101 with a specific pattern upon a packaging glass substrate 100. The surface of the packaging glass substrate 100 with the glass packaging lines 101 faces to the active glass substrate 200, and entirely overlapping upon the active glass substrate 200, in order to couple the packaging glass substrate 100 and the active glass substrate 200 with the packaging glass lines 101.

The glass packaging lines 101 formed upon the packaging glass substrate 100 have the same height. In particular, the glass packaging lines 101 has a height between 1-1000 µm, and glass packaging lines 101 has a width between 10-5000 µm. When disposing the packaging glass substrate 100 entirely overlapping upon the active glass substrate 200, projected images of the glass packaging lines 101 on a plane of the active glass substrate 200 are out of the active area 201. In particular, a distance from each packaging glass line to any position of the active area 201 to the packaging glass lines 101 is between 500-2500 µm and out of the thin film transistor (TFT, not shown). The frame of the display (dark area without LED) will be too wide if the distance between the packaging lines 101 and the active area 201 is too large. However, the active area 201 and transistors (not shown) will be damaged by the heat generated during welding if the distance between the packaging lines 101 and the active area 201 is too small.

Figure 2:
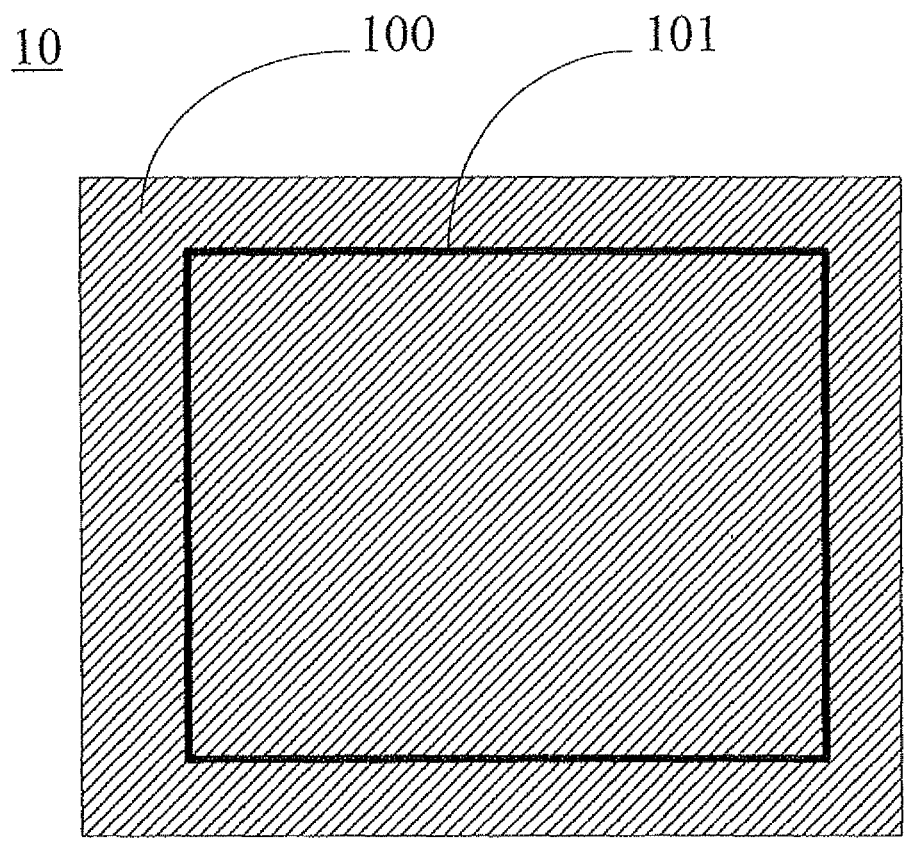
FIG. 2 is a top view drawing of packaging lines on a packaging glass substrate of a glass packaging structure of a first embodiment of the present invention.

FIG. 2 is a top view drawing of packaging lines on a packaging glass substrate of a glass packaging structure of a first embodiment of the present invention. The glass packaging lines 101 are formed on the packaging glass substrate 100 by physical grinding, laser scanning or chemical etching. The arrangement of the pattern of the glass packaging lines 101 upon the glass packaging substrate 100 could be adjusted by the position of active area 201 and TFT under the active glass substrate 200. In particular, the glass packaging lines 101 are disposed around the position of the projection of the active area 201. Since a shape of the active area 201 is usually a rectangular, projected images of the packaging lines 101 of the first embodiment of the present invention in a plane of the active glass substrate 200 is rectangular. The four corners of the packaging lines 101 could be right angles, radius or other shapes. However, if the shape of the projection of the packaging lines on a plane of the active glass substrate is circular, rectangular, rectangular with radius, triangular, or irregular, the shape could be adjusted according to the size and position of the active area 201.

Figure 3:
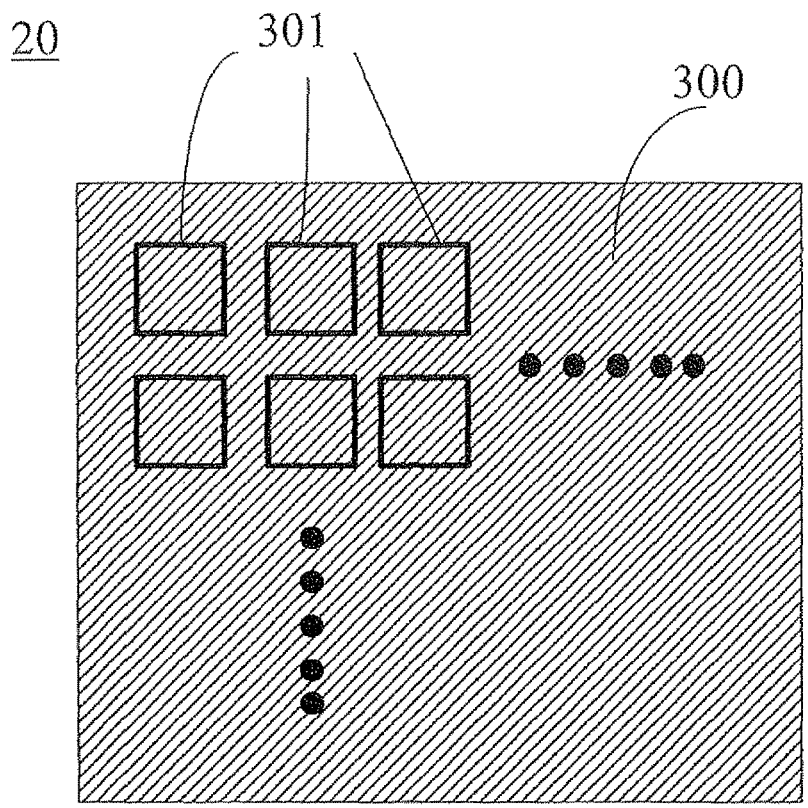
FIG. 3 is a top view drawing of packaging lines on a packaging glass substrate of a glass packaging structure of a second embodiment of the present invention.

FIG. 3 is a top view drawing of packaging lines on a packaging glass substrate of a glass packaging structure of a second embodiment of the present invention. In the second embodiment of the present invention, an active glass substrate (not shown) has a plurality of active areas disposed in different positions upon an active glass substrate (not shown). Hence, a plurality of glass packaging lines 301 is formed in a plurality of rectangles upon a packaging glass substrate 300. Projected images of the packaging lines 301 are around the active area (not shown).

Figure 4:
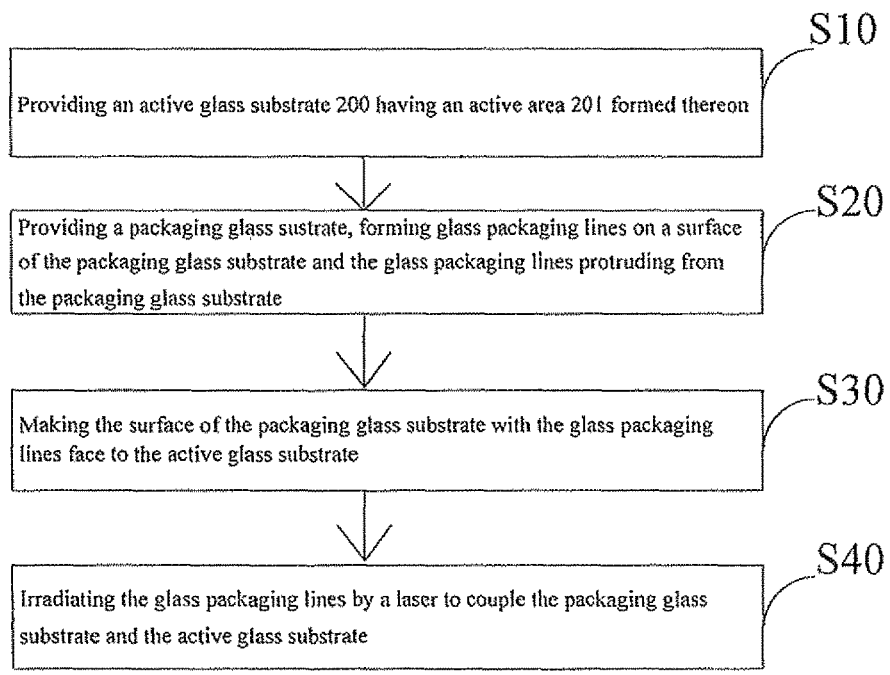
FIG. 4 is a flow chart of the glass packaging method of a glass packaging structure of a first embodiment of the present invention.

FIG. 4 is a flow chart of the glass packaging method of a glass packaging structure of a first embodiment of the present invention. Step S10 providing an active glass substrate 200 having an active area 201 formed thereon. Step S20 providing a packaging glass substrate 100, forming glass packaging lines 101 on a surface of the packaging glass substrate 100 and the glass packaging lines 101 protruding from the packaging glass substrate 100. The glass packaging lines 101 formed upon the packaging glass substrate 100 have the same height. Step S30 making the surface of the packaging glass substrate 100 with the glass packaging lines 101 face to the active glass substrate 200. Step S40 irradiating the glass packaging lines 101 by a laser to couple the packaging glass substrate 100 and the active glass substrate 200.

When disposing the packaging glass substrate 100 entirely overlapping upon the active glass substrate 200, projected images of the glass packaging lines 101 on a plane of the active glass substrate 200 are out of the active area 201. In particular, a distance from each packaging glass line 101 to any position of the active area 201 is between 500-2500 µm and out of the TFT (not shown). The frame of the display (dark area without LED) will be too wide if the distance between the packaging lines 101 and the active area 201 is too large. However, the active area 201 and transistors (not shown) will be damaged by the heat generated during welding if the distance between the packaging lines 101 and the active area 201 is too small.

In particular, the infrared laser has a wavelength ranging between 800-1200 nanometers. The laser is c is controlled to move a focal spot thereof along the packaging glass lines 101 to couple the packaging glass substrate 100 and the active glass substrate 200. The height of each of the positions of the glass packaging lines 101 is maintained after welding.

Figure 5:
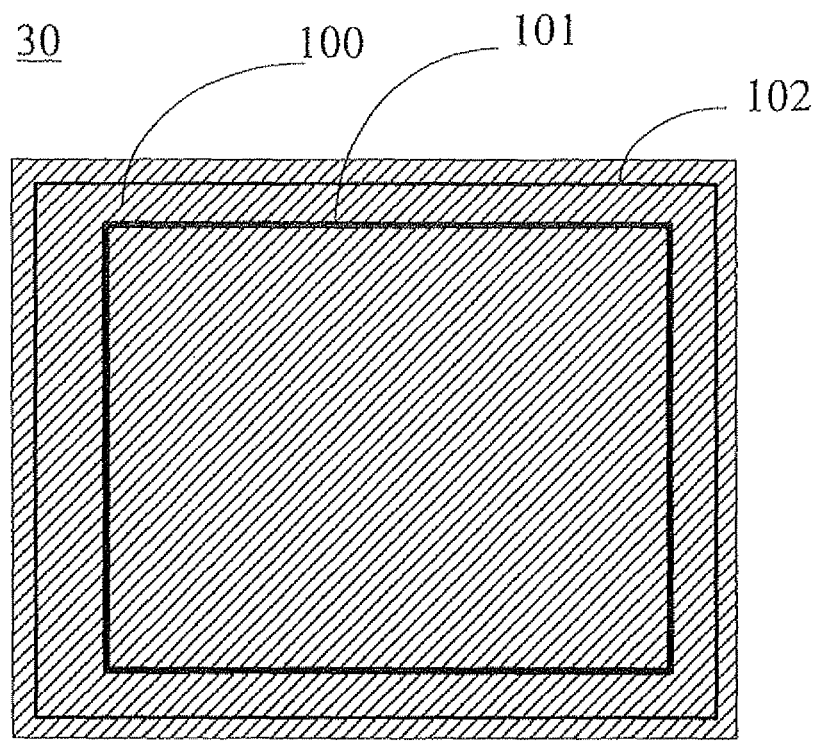
FIG. 5 is a top view drawing of a glass packaging structure of a third embodiment of the present invention.

FIG. 5 is a top view drawing of a glass packaging structure of a third embodiment of the present invention. As shown in FIG. 2, the glass packaging lines 101 are formed on the packaging glass substrate 100. The main difference between the first embodiment of the present invention and the third embodiment of the present invention is coating a circle of extra UV glue 102 on the packaging glass substrate 100. In particular, the position of the UV glue 102 is located outside the glass packaging lines 101. More particularly, the distance from the four sides to the UV glue 102 is between 210 mm.

Figure 6:
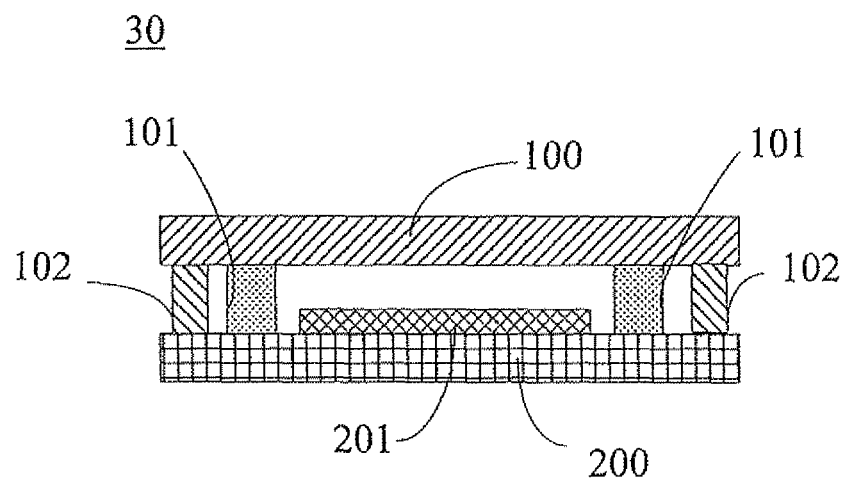
FIG. 6 is a side view drawing of a glass packaging structure of a first embodiment of the present invention.

FIG. 6 is a side view drawing of a glass packaging structure of a first embodiment of the present invention. The packaging process of the glass packaging structure is finished in a chamber of combination equipment (not shown). FIG. 6, the third embodiment of the present invention, discloses that the glass packaging structure 30 comprises an active glass substrate 200 and a packaging glass substrate 100. Forming an active area 201 upon the active glass substrate 200. Forming glass packaging lines 101 protruding from a surface of the packaging glass substrate 100. Making the surface of the packaging glass substrate 100 with the glass packaging lines 101 face to the active glass substrate 200. Disposing the packaging glass substrate 100 entirely overlapping upon the active glass substrate 200. The glass packaging lines 101 formed upon the packaging glass substrate 100 have the same height. In particular, the glass packaging lines 101 have the height ranging between 1-1000 µm, and the glass packaging lines 101 have the width ranging between 10-5000 µm. When disposing the packaging glass substrate 100 entirely overlapping upon the active glass substrate 200, projected images of the glass packaging lines 101 on a plane of the active glass substrate 200 are out of the active area 201. In particular, a distance from each packaging glass line 101 to any position of the active area 201 is between 500-2500 µm and out of the TFT (not shown). The frame of the display (dark area without LED) will be too wide if the distance between the packaging lines 101 and the active area 201 is too large. However, the active area 201 and transistors (not shown) will be damaged by the heat generated during welding if the distance between the packaging lines 101 and the active area 201 is too small.

In the third embodiment of the present invention, a circle of the UV glue 102 is coated on the glass packaging substrate 100. In particular, the position of the UV glue 102 is located outside the glass packaging lines 101. More particularly, the distance from the four sides to the UV glue 102 is between 2-10 mm.

In practice, the chamber of the combination equipment (not shown) will be filled with Nitrogen (N$_2$), Applying a UV mask (not shown) to protect the active area 101 and TFTs (not shown), then using a UV light (not shown) to solidify the UV glue 102 having a sealing environment with N$_2$ inside the UV glue 102, the packaging glass substrate 100 and the active glass substrate 200. Then, irradiating the glass packaging lines 101 by laser to couple the packaging glass substrate 100 and the active glass substrate 200.

Figure 7:
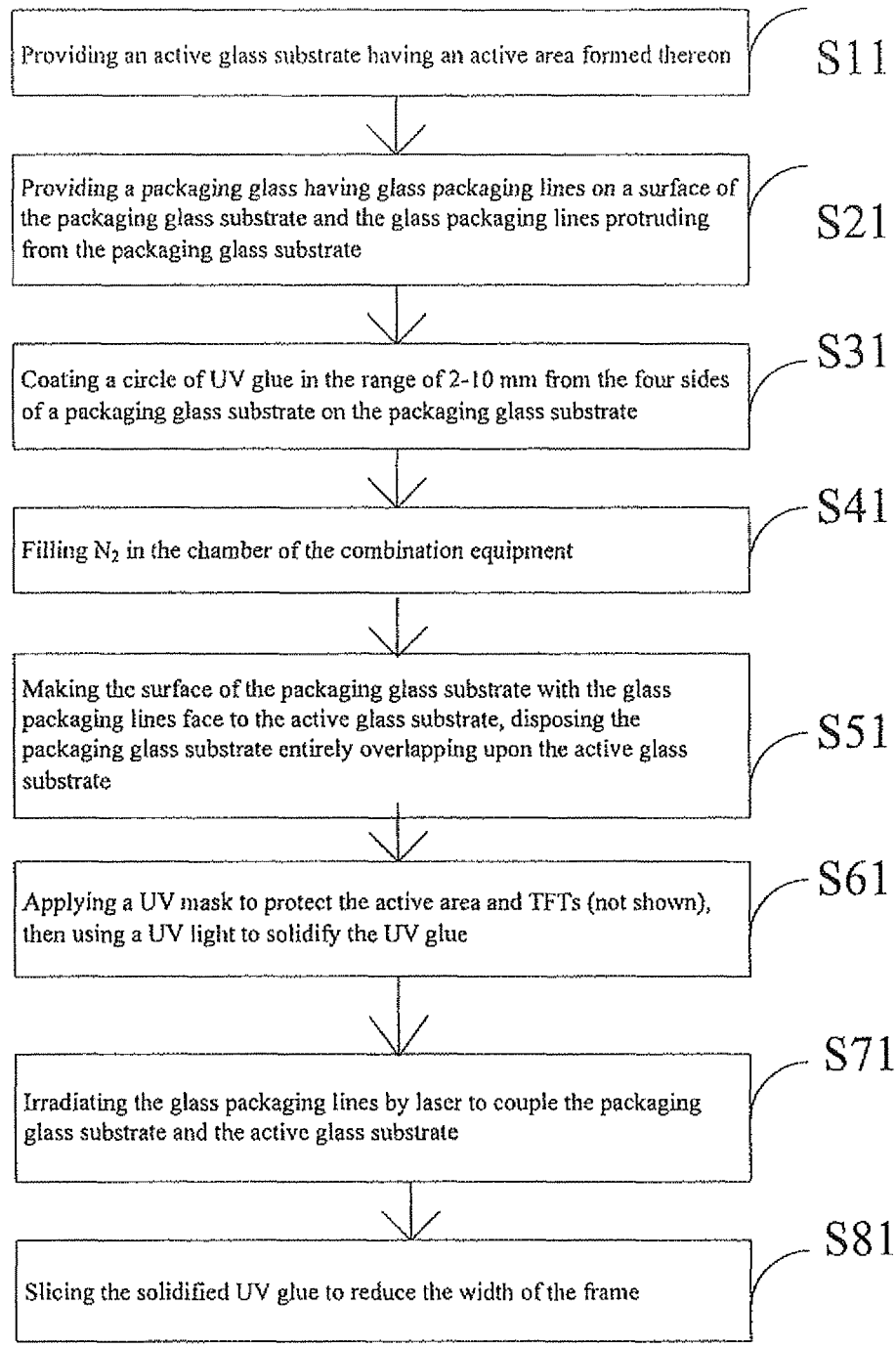
FIG. 7 is a flow chart of the glass packaging method of a glass packaging structure of a third embodiment of the present invention.

FIG. 7 is a flow chart of the glass packaging method of a glass packaging structure of a third embodiment of the present invention. The combination process of the glass packaging structure is finished in a chamber of combination equipment (not shown). Also refer to FIG. 5 and FIG. 6 to describe the glass packaging method. In Step S11, providing an active glass substrate 200 having an active area 201 formed thereon. In step S21, providing a packaging glass having glass packaging lines 101 on a surface of the packaging glass substrate 100 and the glass packaging lines 101 protruding from the packaging glass substrate 100. In step S31, coating a circle of UV glue 102 in the range of 2-10 mm from the four sides of a packaging glass substrate 100 on the packaging glass substrate 100. In step S41, filling N$_2$ in the chamber of the combination equipment. In step S51, making the surface of the packaging glass substrate 100 with the glass packaging lines 101 face to the active glass substrate 200, disposing the packaging glass substrate 100 entirely overlapping upon the active glass substrate 200. In step S61, applying a UV mask (not shown) to protect the active area 101 and TFTs (not shown), then using a UV light (not shown) to solidify the UV glue 102 having a sealing environment with N$_2$ inside the UV glue 102, the packaging glass substrate 100 and the active glass substrate 200. In step S71, irradiating the glass packaging lines 101 by laser to couple the packaging glass substrate 100 and the active glass substrate 200. In step S81, slicing the solidified UV glue 102 to reduce the width of the frame.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A glass packaging method, comprising the following steps of:
    providing an active glass substrate having an active area formed thereon;
    providing a packaging glass substrate;
    removing a portion of a surface of the packaging glass substrate according to a specific pattern to form a recessed space and remain a plurality of glass packaging lines connected to each other and encircling the recessed space, wherein the glass packaging lines are integrally protruding from the packaging glass substrate;
    making, the surface of the packaging glass substrate with the glass packaging lines face to the active glass substrate and directly contacting a surface of the glass packaging lines with the active glass substrate;
    disposing the packaging glass substrate entirely overlapping upon the active glass substrate; and
    irradiating the glass packaging lines by a laser to couple the packaging glass substrate and the active glass substrate without using a glass frit,
    wherein the glass packaging lines funned upon the packaging glass substrate have the same height, and projected images of the glass packaging lines on a plane of the active glass substrate are out of the active area, wherein the glass packaging method further comprises:
coating, on the packaging glass substrate, a circle of ultra violet glue in a range of 2-10 mm from four sides of the packaging glass substrate, and
wherein the glass packaging lines are made from a portion of the packaging glass substrate.

2. The glass packaging method according to claim 1, wherein the glass packaging lines are formed on the packaging glass substrate by removing the portion of the surface of the packaging glass substrate according to the specific pattern through physical grinding, laser scanning or chemical etching.

3. The glass packaging method according to claim 1, wherein a distance from each packaging glass line to any position of the active area is between 500-2500 μm.

4. The glass packaging method according to claim 1, wherein the laser has a wavelength ranging, between 800-1200 nanometers and a power ranging between 5-250 watts.

5. The glass packaging method according to claim 1, wherein the laser is controlled to move a focal spot thereof along the packaging, glass lines to couple the packaging glass substrate and the active glass substrate.

6. A glass packaging method, comprising the following steps of:
providing active glass substrate having an active area formed thereon;
providing a packaging glass substrate;
removing a portion of a surface of the packaging glass substrate according to a specific pattern to form a recessed space and remain a plurality glass packaging lines connected to each other and encircling the recessed space, wherein the glass packaging lines are integrally protruding from the packaging glass substrate;
making the surface of the packaging glass substrate with the glass packaging lines face to the active glass substrate, and directly contacting a surface of the glass packaging lines with the active glass substrate;
disposing the packaging glass substrate entirely overlapping upon the active glass substrate; and
irradiating the glass packaging lines by a laser to couple the packaging glass substrate and the active glass substrate without using a glass frit,
wherein the glass packaging lines formed upon the packaging glass substrate have the same height, and projected images of the glass packaging lines on a plane of the active glass substrate are out of the active area, and
wherein the glass packaging lines are made from a portion of the packaging glass substrate.

* * * * *